(12) United States Patent
Isakanian et al.

(10) Patent No.: US 8,134,386 B2
(45) Date of Patent: Mar. 13, 2012

(54) HYBRID FREQUENCY COMPENSATION NETWORK

(75) Inventors: Patrick Isakanian, Folsom, CA (US); Kenneth C. Dyer, Davis, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 649 days.

(21) Appl. No.: 12/284,773

(22) Filed: Sep. 24, 2008

(65) Prior Publication Data

US 2009/0232033 A1 Sep. 17, 2009

Related U.S. Application Data

(63) Continuation of application No. 12/012,826, filed on Feb. 5, 2008, now abandoned.

(60) Provisional application No. 60/900,180, filed on Feb. 7, 2007.

(51) Int. Cl.
*H03K 17/16* (2006.01)
(52) U.S. Cl. ......................................................... 326/30
(58) Field of Classification Search ...................... 326/30
See application file for complete search history.

(56) References Cited

U.S. PATENT DOCUMENTS 6,433,626 B1 * 8/2002 Guimaraes .................... 327/552

OTHER PUBLICATIONS

Michael Moyal, Martin Groepl, and Thomas Blon, A 25-kft, 768-kb/s CMOS Analog Front End for Multiple-Bit-Rate DSL Transceiver, IEEE Journal of Solid-State Circuits, vol. 34, No. 12, Dec. 1999.
Pierte Roo, Sehat Sutardja, Shurn Wei, Farbod Aram, Yi Cheng, A CMOS Transceiver Analog Front End for Gigabit Ethernet over CAT-5 Cables, ISSCC 2001, Session 19.

* cited by examiner

*Primary Examiner* — Shawki S Ismail
*Assistant Examiner* — Thienvu Tran
(74) *Attorney, Agent, or Firm* — Dorsey & Whitney LLP

(57) ABSTRACT

Hybrid frequency compensation is provided. Hybrid circuits are used to subtract the transmit signal from the receive signal in a full duplex communication system. Since the hybrid circuit and the main line driver are exposed to different loads, accurate subtraction is difficult to achieve. A frequency dependent network is used to match the loading seen by the driver and the hybrid. The compensation network can be based on active and/or passive components.

9 Claims, 2 Drawing Sheets

Schematic Representation of the Preferred Embodiment

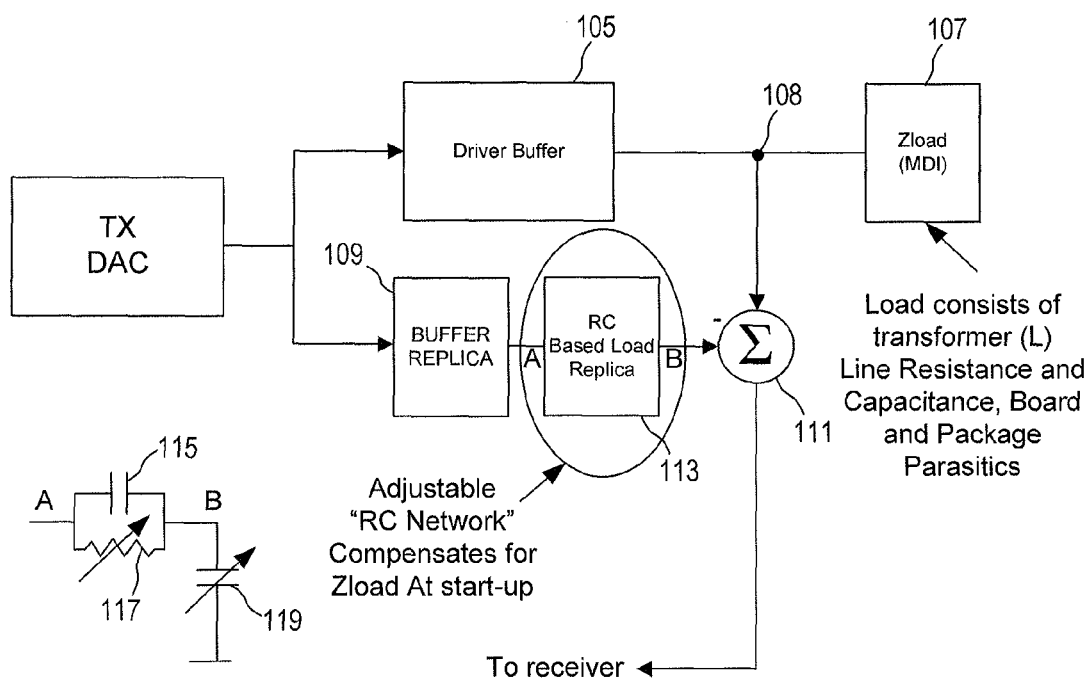
Figure 1. Conceptual diagram of Driver/Hybrid and Frequency Compensation Network

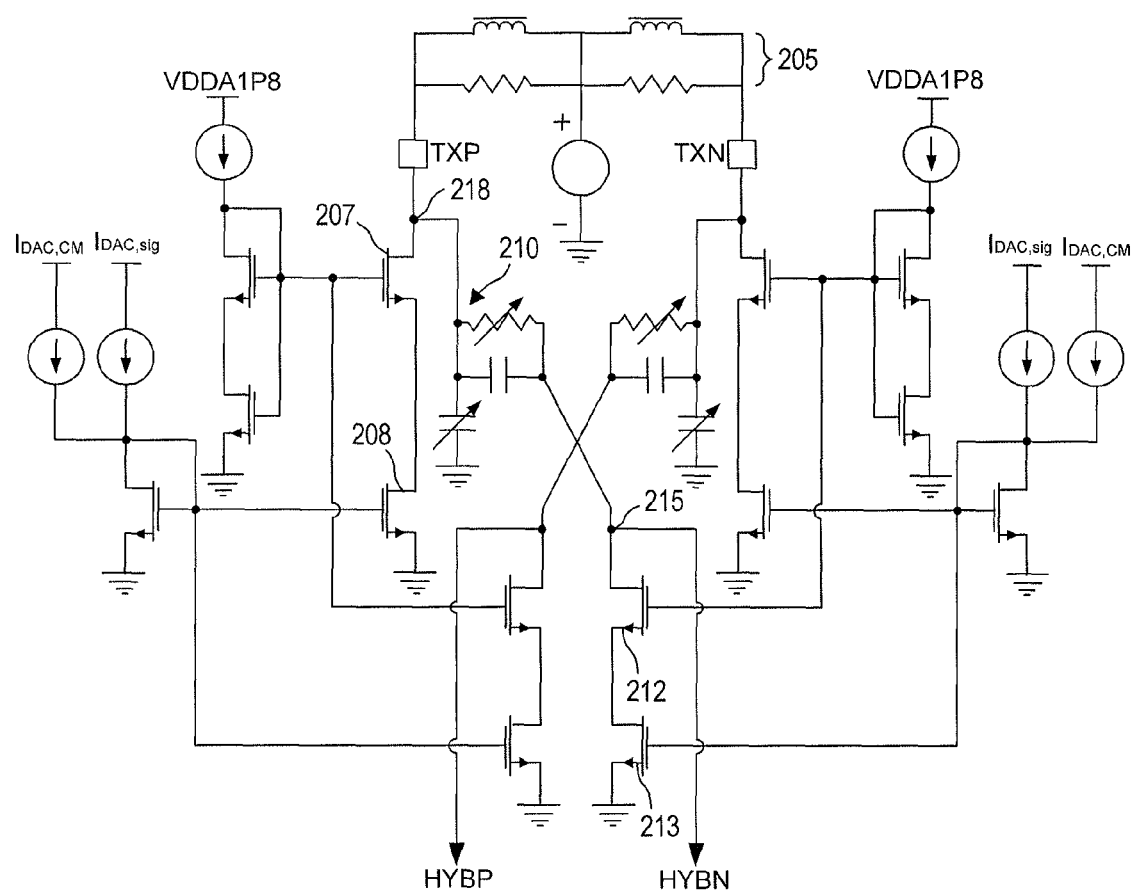
Figure 2. Schematic Representation of the Preferred Embodiment

HYBRID FREQUENCY COMPENSATION NETWORK

CROSS-REFERENCE TO RELATED APPLICATIONS

This application is a continuation of U.S. application Ser. No. 12/012,826 filed Feb. 5, 2008 now abandoned. U.S. application Ser. No. 12/012,826 filed Feb. 5, 2008 claims priority from U.S. provisional patent application No. 60/900,180 filed Feb. 7, 2007, which is incorporated herein by reference.

FIELD OF THE INVENTION

The present invention relates generally to communication systems. More particularly, the present invention relates to hybrid frequency compensation network.

BACKGROUND

Hybrid circuits are used to subtract the transmit signal from the receive signal in a full duplex communication system. Since the Hybrid circuit and the main line driver are exposed to different loads, accurate subtraction over signal frequency is difficult to achieve. Prior developments have focused on matching edges (rise/fall times) with resistive trimming or lowpass filtering to obtain good subtraction by edge matching or had off chip compensation networks.

SUMMARY

Examples of the invention use a frequency dependent network in the Hybrid that matches, as closely as possible, the loading seen by the driver and the Hybrid. Trimming can make the compensation network more robust. The compensation network can be designed based on active and/or passive components. The trimming of the compensation network can be done during startup calibration or wafer sort. It does not require off-chip components and does not attenuate the signal by lowpass filtering.

BRIEF DESCRIPTION OF THE FIGURES

FIG. 1 is a schematic illustration of a driver, hybrid, and frequency compensation network in accordance with an embodiment of the present invention.

FIG. 2 is a schematic illustration of an embodiment of the present invention.

DETAILED DESCRIPTION

FIG. 1 shows the Driver, Hybrid, and Frequency Compensation Network (FCN). The Driver consists of a buffer 105 that is capable of driving Zload 107. The transmitted signal is accordingly provided at a node 108. Note that the node 108 may also receive a receive signal from the load 107. A replica buffer 109 provides a replica of the transmitted signal at node 'B' so that a summer 111 may subtract the transmitted signal from the received signal, both of which may be present at the node 108. The receive signal may then be sent to the receiver, as shown. The receive data shares the same pins as the transmit buffer schematically shown as node 108. The replica buffer 109 and Frequency Compensation Network 113 act to provide accurate subtraction of the transmitted data. The accuracy of the subtraction depends on how well the main Driver and Replica circuits match as well as how well the loading of the Driver and the replica match. An example implementation of the frequency compensation network 113 is shown in FIG. 1 using capacitor 115, adjustable resistor 117, and adjustable capacitor 119. The Driver 105 will experience loading due to resistances, capacitances and Inductances. The frequency compensation network 113 accordingly must provide an equivalent load to the Hybrid if the transmit signal is to be subtracted from the received signal accurately across the useable signal bandwidth. A combination of active and/or passive devices can be utilized to minimize the error. The error refers to that portion of the transmit signal that is not effectively removed from the received data. Effectively, the FCN shapes the Hybrid response to equal the transmit response.

FIG. 2 is a schematic illustration of an embodiment of the present invention. An implementation of the load 107 of FIG. 1 is shown schematically as inductors and resistors 205. A differential implementation of the driver 105 of FIG. 1 is shown schematically in FIG. 2 as including transistors 207 and 208 as one end of the differential circuit. The nodes TXP and TXN of FIG. 2 may correspond to the node 108 of FIG. 1. An adjustable RC network 210 is also shown in FIG. 2, which may be used to implement all or a portion of the frequency compensation network 113 of FIG. 1. A buffer replica shown in FIG. 2 may include the transistors 212 and 213, which may be half of a differential implementation of the buffer replica 109 of FIG. 1.

Accordingly, a transmit and receive signal may be present at node 218. A compensated version of these signals may be provided through the network 210 to the node 215. The transistors 212 and 213 may provide a complementary version of the transmit signal, as they pertain to the opposite end of the differential circuit. Accordingly, the signal at node 215 may be substantially equal to the receive signal.

As one of ordinary skill in the art will appreciate, various changes, substitutions, and alterations could be made or otherwise implemented without departing from the principles of the present invention. Accordingly, the examples and drawings disclosed herein including the appendix are for purposes of illustrating the preferred embodiments of the present invention and are not to be construed as limiting the invention.

We claim:

1. A hybrid circuit comprising:
a driver circuit configured to receive a differential input signal, wherein the differential input signal includes first and second input signals, wherein the driver circuit is further configured to buffer the differential input signal to generate a first signal for transmission to a load, wherein the first signal is based, at least in part, on the differential input signal, wherein the driver circuit includes a first driver circuit configured to receive the first input signal and a second driver circuit configured to receive the second input signal, and wherein at least one of the first or second driver circuits comprises a transistor further configured to receive at least one of the first or second input signals at a gate terminal;
a terminal coupled to the driver circuit and configured to provide the first signal to the load and receive a second signal through the load, wherein the first and second signals are respectively provided and received at least partially simultaneously;
a replica circuit configured to receive the differential input signal, at least partially replicate an operation of the driver circuit, and generate an output signal, wherein the replica circuit includes a first replica circuit configured to receive the first input signal and a second replica circuit configured to receive the second input signal;

a load replica coupled to the replica circuit, wherein the load replica has an impedance based, at least in part, on an impedance of the load, wherein the load replica is configured to receive the output signal and generate an adjusted output signal, and wherein the load replica includes a first load replica coupled between an output of the first driver circuit and an output of the second replica circuit and a second load replica coupled between an output of the second driver circuit and an output of the first replica circuit; and a combiner coupled to the terminal and the load replica and configured to subtract the adjusted output signal from a combination of the first and second signals received at the terminal.

2. The hybrid circuit of claim 1, wherein the adjusted output signal is approximately equal to the first signal.

3. The hybrid circuit of claim 1, wherein the combiner is further configured to generate an approximation of the second signal based, at least in part, on the subtraction of the adjusted output signal from the combination of the first and second signals.

4. The hybrid circuit of claim 1, wherein the impedance of the load replica is approximately equal to the impedance of the load.

5. The hybrid circuit of claim 1, wherein the load replica is further configured to match loading seen by the driver circuit.

6. The hybrid circuit of claim 1, wherein the load replica comprises an adjustable capacitor.

7. The hybrid circuit of claim 1, wherein the load replica comprises an adjustable resistor.

8. The hybrid circuit of claim 1, wherein the load replica is further coupled to the terminal.

9. The hybrid circuit of claim 1, wherein the transistor is a first transistor, and wherein the replica circuit further comprises a second transistor further configured to receive at least a portion of the differential input signal at a gate terminal.

* * * * *